United States Patent
Yen et al.

(10) Patent No.: US 11,225,409 B2
(45) Date of Patent: Jan. 18, 2022

(54) SENSOR WITH INTEGRATED HEATER

(71) Applicant: InvenSense, Inc., San Jose, CA (US)

(72) Inventors: Pei-Wen Yen, Hsinchu (TW); Ting-Yuan Liu, Zhubei (TW); Jye Ren, Taipei (TW); Chung-Hsien Lin, Hsinchu (TW); Joseph Seeger, Menlo Park, CA (US); Calin Miclaus, Fremont, CA (US)

(73) Assignee: InvenSense, Inc., San Jose, CA (US)

( * ) Notice: Subject to any disclaimer, the term of this patent is extended or adjusted under 35 U.S.C. 154(b) by 154 days.

(21) Appl. No.: 16/574,037

(22) Filed: Sep. 17, 2019

(65) Prior Publication Data

US 2020/0087142 A1 Mar. 19, 2020

Related U.S. Application Data

(63) Continuation-in-part of application No. 16/520,228, filed on Jul. 23, 2019, and a continuation-in-part of application No. 16/378,322, filed on Apr. 8, 2019, now Pat. No. 10,964,613.

(60) Provisional application No. 62/732,325, filed on Sep. 17, 2018.

(51) Int. Cl.
  *B81B 7/00* (2006.01)
(52) U.S. Cl.
  CPC .... *B81B 7/0087* (2013.01); *B81B 2201/0264* (2013.01); *B81B 2203/0127* (2013.01); *B81B 2203/04* (2013.01)

(58) Field of Classification Search
  CPC .......... B81B 7/0087; B81B 2201/0264; B81B 2203/0127; B81B 2203/04
  See application file for complete search history.

(56) References Cited

U.S. PATENT DOCUMENTS

| 4,546,412 A | 10/1985 | Nakazawa et al. |
| 4,625,561 A | 12/1986 | Mikkor |
| 4,730,496 A | 3/1988 | Knecht et al. |
| 4,732,042 A | 3/1988 | Adams |
| 4,769,738 A | 9/1988 | Nakamura et al. |
| 4,838,089 A | 6/1989 | Okada et al. |
| 4,842,685 A | 6/1989 | Adams |

(Continued)

FOREIGN PATENT DOCUMENTS

| CN | 1334919 A | 2/2002 |
| CN | 1440504 A | 9/2003 |

(Continued)

OTHER PUBLICATIONS

EP Extended Search Report dated Apr. 25, 2014 in EP Application No. 13005235.0 9 pages.

(Continued)

*Primary Examiner* — Marc Anthony Armand

(57) ABSTRACT

A device includes a microelectromechanical system (MEMS) sensor die comprising a deformable membrane, a MEMS heating element, and a substrate. The MEMS heating element is integrated within a same layer and a same plane as the deformable membrane. The MEMS heating element surrounds the deformable membrane and is separated from the deformable membrane through a trench. The MEMS heating element is configured to generate heat to heat up the deformable membrane. The substrate is coupled to the deformable membrane.

17 Claims, 8 Drawing Sheets

(56) References Cited

U.S. PATENT DOCUMENTS

| | | |
|---|---|---|
| 4,949,581 A | 8/1990 | Rud |
| 4,975,390 A | 12/1990 | Fujii et al. |
| 5,062,303 A | 11/1991 | Peterson et al. |
| 5,113,868 A | 5/1992 | Wise et al. |
| 5,155,061 A | 10/1992 | O'Connor et al. |
| 5,277,068 A | 1/1994 | Fukiura et al. |
| 5,332,469 A | 7/1994 | Mastrangelo |
| 5,334,569 A | 8/1994 | Kisalus |
| 5,335,550 A | 8/1994 | Satou |
| 5,343,064 A | 8/1994 | Spangler et al. |
| 5,344,523 A | 9/1994 | Fung et al. |
| 5,395,585 A | 3/1995 | Goldstein |
| 5,407,501 A | 4/1995 | Koen et al. |
| 5,470,797 A | 11/1995 | Mastrangelo |
| 5,473,512 A | 12/1995 | Degani et al. |
| 5,525,280 A | 6/1996 | Shukia et al. |
| 5,557,972 A | 9/1996 | Jacobs et al. |
| 5,576,251 A | 11/1996 | Garabedian et al. |
| 5,578,843 A | 11/1996 | Garabedian et al. |
| 5,586,388 A | 12/1996 | Hirao et al. |
| 5,683,594 A | 11/1997 | Hocker et al. |
| 5,767,447 A | 6/1998 | Dudderar et al. |
| 5,929,498 A | 7/1999 | Ismail et al. |
| 5,936,164 A | 8/1999 | Sparks et al. |
| 5,996,419 A | 12/1999 | Sokn |
| 6,020,219 A | 2/2000 | Dudderar et al. |
| 6,038,928 A | 3/2000 | Maluf et al. |
| 6,074,890 A | 6/2000 | Yao et al. |
| 6,140,144 A | 10/2000 | Najafi et al. |
| 6,143,583 A | 11/2000 | Hays |
| 6,208,019 B1 | 3/2001 | Tane et al. |
| 6,229,190 B1 | 5/2001 | Bryzek et al. |
| 6,346,742 B1 | 2/2002 | Bryzek et al. |
| 6,393,922 B1 | 5/2002 | Winterer |
| 6,433,427 B1 | 8/2002 | Wu et al. |
| 6,441,451 B1 | 8/2002 | Ikeda et al. |
| 6,441,503 B1 | 8/2002 | Webster |
| 6,458,622 B1 | 10/2002 | Keser et al. |
| 6,465,271 B1 | 10/2002 | Ko et al. |
| 6,499,351 B1 | 12/2002 | Najafi et al. |
| 6,512,255 B2 | 1/2003 | Aoki et al. |
| 6,520,014 B1 | 2/2003 | Brandi |
| 6,533,554 B1 | 3/2003 | Vargo et al. |
| 6,552,404 B1 | 4/2003 | Hynes et al. |
| 6,556,418 B2 | 4/2003 | Aigner et al. |
| 6,568,274 B1 | 5/2003 | Lucas |
| 6,584,854 B2 | 7/2003 | Kimura et al. |
| 6,700,174 B1 | 3/2004 | Miu et al. |
| 6,713,828 B1 | 3/2004 | Chavan et al. |
| 6,743,656 B2 | 6/2004 | Orcutt et al. |
| 6,777,263 B1 | 8/2004 | Gan et al. |
| 6,927,482 B1 | 8/2005 | Kim et al. |
| 6,962,867 B2 | 11/2005 | Jackson et al. |
| 6,973,835 B2 | 12/2005 | Rangsten et al. |
| 7,015,060 B1 | 3/2006 | Kubena et al. |
| 7,036,380 B2 | 5/2006 | Fessele et al. |
| 7,122,458 B2 | 10/2006 | Cheng et al. |
| 7,246,525 B2 | 7/2007 | Birkelund et al. |
| 7,273,763 B1 | 9/2007 | Neumeier et al. |
| 7,284,435 B2 | 10/2007 | Ueno |
| 7,434,474 B1 | 10/2008 | DuPuis |
| 7,454,976 B2 | 11/2008 | Wanami et al. |
| 7,468,552 B2 | 12/2008 | Ohta et al. |
| 7,482,193 B2 | 1/2009 | Dcamp et al. |
| 7,539,003 B2 | 5/2009 | Ray et al. |
| 7,704,774 B2 | 4/2010 | Mayer et al. |
| 8,008,738 B2 | 8/2011 | Villa et al. |
| 8,049,287 B2 | 11/2011 | Combi et al. |
| 8,191,423 B2 | 6/2012 | Chiou et al. |
| 8,304,919 B2 | 11/2012 | Pendse et al. |
| 8,322,225 B2 | 12/2012 | Bentley et al. |
| 8,536,663 B1 | 9/2013 | Kuo et al. |
| 8,567,256 B2 | 10/2013 | Albicker et al. |
| 8,671,766 B2 | 3/2014 | Sterling et al. |
| 8,704,318 B2 | 4/2014 | Zhou |
| 8,946,833 B2 | 2/2015 | Higgins, III |
| 9,330,929 B1 | 5/2016 | Kautzsch et al. |
| 9,362,479 B2 | 6/2016 | Lo |
| 9,476,788 B2 | 10/2016 | Kalandar et al. |
| 9,581,512 B2 | 2/2017 | Lin |
| 9,783,411 B1 | 10/2017 | Potasek |
| 9,863,828 B2 | 1/2018 | Imai et al. |
| 10,081,537 B2 | 9/2018 | Sooriakumar et al. |
| 10,244,644 B2 | 3/2019 | Chiou et al. |
| 10,281,437 B2 | 5/2019 | Leaders et al. |
| 10,330,552 B2 | 6/2019 | Uematsu |
| 10,481,024 B2 | 11/2019 | Wade et al. |
| 10,684,184 B2 | 6/2020 | Wade et al. |
| 10,787,361 B2 | 9/2020 | Doraisamy et al. |
| 11,054,329 B2 | 7/2021 | MacNeil et al. |
| 2001/0023087 A1 | 9/2001 | Brandi |
| 2002/0048839 A1 | 4/2002 | Miller et al. |
| 2002/0185737 A1 | 12/2002 | Regan et al. |
| 2003/0019299 A1 | 1/2003 | Horie |
| 2003/0056598 A1 | 3/2003 | Kimura et al. |
| 2003/0093895 A1 | 5/2003 | Miyazaki et al. |
| 2003/0107868 A1 | 6/2003 | Chatzandroulis |
| 2003/0143775 A1 | 7/2003 | Brady |
| 2003/0154796 A1 | 8/2003 | Ishio et al. |
| 2003/0225360 A1* | 12/2003 | Eppstein ............. A61N 1/327 604/19 |
| 2004/0171195 A1 | 9/2004 | Raben |
| 2005/0016289 A1 | 1/2005 | Saito et al. |
| 2005/0124159 A1 | 6/2005 | Kalvesten et al. |
| 2005/0156320 A1 | 7/2005 | Mastromatteo |
| 2005/0229711 A1 | 10/2005 | Ohms et al. |
| 2006/0014358 A1 | 1/2006 | Sawyer et al. |
| 2006/0027522 A1 | 2/2006 | Martin et al. |
| 2006/0032039 A1 | 2/2006 | Rangsten et al. |
| 2006/0063354 A1 | 3/2006 | Fortin et al. |
| 2006/0097331 A1 | 5/2006 | Hattori et al. |
| 2006/0169049 A1 | 8/2006 | Matsubara |
| 2006/0229045 A1 | 10/2006 | Choi et al. |
| 2006/0243054 A1 | 11/2006 | Saito et al. |
| 2007/0017294 A1 | 1/2007 | Asada et al. |
| 2007/0019101 A1 | 1/2007 | Minamio et al. |
| 2007/0141808 A1 | 6/2007 | Firtin et al. |
| 2007/0275495 A1 | 11/2007 | Meyer et al. |
| 2007/0279845 A1 | 12/2007 | Kuhnt et al. |
| 2008/0016683 A1 | 1/2008 | Brida et al. |
| 2008/0036082 A1 | 2/2008 | Eun |
| 2008/0061412 A1 | 3/2008 | Shen et al. |
| 2008/0236292 A1 | 10/2008 | Reijs |
| 2008/0251705 A1 | 10/2008 | Tseng |
| 2009/0166827 A1 | 7/2009 | Foster et al. |
| 2009/0322929 A1 | 12/2009 | Webster |
| 2010/0055821 A1 | 3/2010 | Buhler et al. |
| 2010/0109140 A1 | 5/2010 | Oh et al. |
| 2010/0139409 A1 | 6/2010 | Mischke et al. |
| 2010/0141362 A1* | 6/2010 | Lee ............. H01P 1/127 333/262 |
| 2010/0171153 A1 | 7/2010 | Yang |
| 2010/0207217 A1 | 8/2010 | Zuniga-Ortiz et al. |
| 2010/0242605 A1 | 9/2010 | Offterdinger |
| 2010/0300201 A1 | 12/2010 | Ge et al. |
| 2011/0027930 A1 | 2/2011 | El-Gamal et al. |
| 2011/0108932 A1 | 5/2011 | Benzel |
| 2011/0154905 A1 | 6/2011 | Hsu |
| 2011/0230068 A1 | 9/2011 | Pahl |
| 2012/0024075 A1 | 2/2012 | Peng |
| 2012/0037935 A1 | 2/2012 | Yang |
| 2012/0037953 A1 | 2/2012 | Hayano |
| 2013/0093030 A1 | 4/2013 | Isebrand et al. |
| 2013/0127000 A1 | 5/2013 | Oganesian |
| 2013/0181314 A1 | 7/2013 | Ryu et al. |
| 2013/0264755 A1 | 10/2013 | Eskridge |
| 2013/0276544 A1 | 10/2013 | Potasek et al. |
| 2014/0151822 A1 | 6/2014 | Graham |
| 2015/0040675 A1 | 2/2015 | Ding |
| 2015/0048461 A1 | 2/2015 | Mayer |
| 2015/0061049 A1 | 3/2015 | Weber |
| 2015/0122038 A1 | 5/2015 | Mayer et al. |
| 2015/0122041 A1 | 5/2015 | Lin |
| 2015/0122042 A1 | 5/2015 | Lin et al. |

(56) References Cited

U.S. PATENT DOCUMENTS

| | | | |
|---|---|---|---|
| 2015/0260593 | A1 | 9/2015 | Hsu et al. |
| 2015/0268115 | A1 | 9/2015 | Robert et al. |
| 2015/0270182 | A1 | 9/2015 | Yang |
| 2016/0025583 | A1 | 1/2016 | Besling et al. |
| 2016/0290883 | A1 | 10/2016 | Schumm |
| 2017/0122825 | A1 | 5/2017 | Naumann |
| 2017/0210618 | A1 | 7/2017 | Chang |
| 2018/0044173 | A1 | 2/2018 | Netzer |

FOREIGN PATENT DOCUMENTS

| | | | |
|---|---|---|---|
| CN | 102169038 | A | 8/2011 |
| CN | 103597330 | A | 2/2014 |
| CN | 104515640 | A | 4/2015 |
| DE | 10027234 | A1 | 12/2000 |
| DE | 19929025 | A1 | 12/2000 |
| DE | 10201054 | A1 | 1/2003 |
| DE | 10-2005-008959 | A1 | 9/2006 |
| DE | 10-2009-046692 | A1 | 5/2011 |
| DE | 10-2010-001073 | A1 | 7/2011 |
| EP | 0155517 | A2 | 9/1985 |
| EP | 0596711 | A2 | 5/1994 |
| EP | 0633459 | A2 | 1/1995 |
| EP | 0993778 | A1 | 4/2000 |
| EP | 0992778 | A2 | 4/2001 |
| EP | 1555517 | A2 | 7/2005 |
| EP | 1860417 | A2 | 11/2007 |
| EP | 2075221 | A2 | 7/2009 |
| EP | 2135839 | A2 | 12/2009 |
| EP | 2246292 | A2 | 11/2010 |
| EP | 2421037 | A1 | 2/2012 |
| EP | 2647594 | A2 | 10/2013 |
| EP | 2653443 | A2 | 10/2013 |
| EP | 2790214 | A1 | 10/2014 |
| EP | 2871455 | A1 | 5/2015 |
| JP | H1019709 | A | 1/1998 |
| JP | 2007-057238 | A | 3/2007 |
| WO | 0214821 | A2 | 2/2002 |
| WO | 2003/006387 | A2 | 1/2003 |
| WO | 2003/034016 | A1 | 4/2003 |
| WO | 03/036387 | A2 | 5/2003 |
| WO | 2004/106879 | A1 | 12/2004 |
| WO | 00/036387 | A1 | 6/2006 |
| WO | 2007/117198 | A1 | 10/2007 |
| WO | 2015090771 | A1 | 6/2015 |

OTHER PUBLICATIONS

Klaassen, et al., "Silicon Fusion Bonding and Deep Reactive Ion Etching; A New Technology From Microstructures," The 8th International Conference on Solid-State Sensors and Actuators, and Eurosensors IX, Stockholm, Sweden, Jun. 25-29, 1995 4 pages.

Allan, Roger, "Ever-Shrinking Ics Turn to Exotic Packaging Methods," Jan. 15, 2009, Electronic Design, retrieved from http://electronicdesign.com/interconnects/ever-shrinking-ics-turn-exotic-packaging-methods. 4 pages.

Allan, Rogers, "MEMS Inertial Sensors Push Size, Performance Limits for Next-Gen Mobile Devices," Apr. 14, 2010, Electronic Design, retrieved from https://eletronicdesign.com/components/mems-inertial-sensors-push-size-performance-limits-next-gen-mobile-devices. 6 pages.

Allan, Roger, Figure 2 in "Ever-Shrinking ICs Turn to Exotic Packaging Methods," Jan. 15, 2009, Electronic Desgin, Retrieved from https://electronicdesign.com/site-files/electronicdesign.com/files/archive/electronicdesign.com/files/29/2037/fig_02_gif. 1 page.

Allan, Roger, Figure 8 in "MEMS Inertial Sensors Push Size, Performance Limits for Net-Gen Mobile Devices," Apr. 14, 2010, Electronic Design, retrieved from https://electronicdeisng.com/site-files/electronicdesign.com/files/archive/electronicdesign.com/Content/14978/60071_fig_08.jpg. 1 page.

Baltes, et al., CMOS-based Microsensors and Packaging, Semsors and Actuators, vol. 92, No. 1-3 pp. 1-9, Aug. 1, 2011 9 pages.

EP Extended Search Report dated Apr. 3, 2013 in EP Application No. 12007333.3 6 pages.

EP Extended Search Report dated Apr. 28, 2014 in EP Application No. 13005236.8 11 pages.

EP Extended Search Report dated Dec. 9, 2010 in EP Application No. 10009453.1 7 pages.

EP Extended search Report dated May 31, 2016 in EP Application No. 13005235.0 11 pages.

EP Wxtended Search Report dated Nov. 20, 2015 in EP Application No. 15173033.0 10 pages.

EP Extended Search Report dated Oct. 2, 2015 in EP Application No. 15000967.8 6 pages.

EP Extended Search Report dated Oct. 20, 2009 in EP Application No. 07008470.2 18 pages.

EP Extended Search Report dated Oct. 11, 2006 in EP Application No. 06010606.9 10 pages.

Kiihamaki, et al., "Integrated Pressure Sensors on SOI," Micro Structure Workshop, 2004 4 pages.

Petersen, et al., "Silicon Fusion Bonding for Pressure Sensors," NovaSensor, TH215-4/88/0000-01444, pp. 144-147. 4 pages.

Wikipedia, "Silicon on Insulator," Oct. 17, 2013, pp. 1-5 5 pages.

Office Action received for Chinese Patent Application Serial No. 201980038311.8 dated Nov. 9, 2021, 09 pages.

\* cited by examiner

SENSOR WITH INTEGRATED HEATER

RELATED APPLICATIONS

The instant application is a non-provisional patent application claiming the benefit and priority to the U.S. Provisional Application No. 62/732,325 filed on Sep. 17, 2018, which is incorporated herein by reference in its entirety. The instant application is a continuation-in-part non-provisional patent application and claims the benefit and priority to a U.S. application Ser. No. 16/520,228 filed on Jul. 23, 2019, which is incorporated herein by reference in its entirety. The instant application is also a continuation-in-part non-provisional patent application and claims the benefit and priority to a U.S. application Ser. No. 16/378,322 filed on Apr. 8, 2019, which is incorporated herein by reference in its entirety.

BACKGROUND

Many electronic devices are used in various conditions and are exposed to different external environments. For example, sensors may come in contact with the external environment such as water that may be damaging to the sensing device in addition to causing performance degradation. Unfortunately, sensors are sensitive to these external environments, e.g., water droplets on the membrane may cause an offset resulting in performance degradation. Moreover, electronic devices may be used in different temperature conditions. Unfortunately, sensor performance shifts after it is installed on a board, e.g., soldered on a printed circuit board (PCB), due to temperature dependent parameters, e.g., temperature coefficient of offset (TCO). Some attempts have been made to address performance degradation by using calibration algorithm to compensate for temperature effect before the sensor is installed, hence soldered on a board. Unfortunately, calibration algorithm used before soldering the sensor does not address or compensate for temperature coefficient offset resulting after soldering the sensor.

SUMMARY

Accordingly, a need has arisen to calibrate the sensor after it is soldered on a board in order to address temperature coefficient offset. Furthermore, a need has arisen to address and remove liquid from the sensor environment when liquid is detected.

In some embodiments, a device includes a microelectromechanical system (MEMS) sensor die comprising a deformable membrane, a MEMS heating element, and a substrate. The MEMS heating element is integrated within a same layer and a same plane as the deformable membrane. The MEMS heating element surrounds the deformable membrane and is separated from the deformable membrane through a trench. The MEMS heating element is configured to generate heat to heat up the deformable membrane. The substrate is coupled to the deformable membrane.

In some embodiments, the trench is within a passivation layer. It is appreciated that a material within the trench may be selected from a group consisting of Silicon Nitride and Silicon Oxide.

In some embodiments, the device includes a second trench. The trench is disposed between the MEMS heating element and the membrane and the second trench is disposed on an outer periphery of the MEMS heating element configured to electrically isolate the MEMS heating element from the peripheral layer. It is appreciated that the second trench is disposed between a peripheral layer and the MEMS heating element.

In some embodiments, a periphery of the deformable membrane is disposed on an oxide layer. The deformable membrane, the oxide layer, and the substrate form a cavity, and the substrate includes an electrode that is formed on a top surface of the substrate that faces the deformable membrane within the cavity. According to some embodiments, the MEMS heating element is disposed on the oxide layer.

It is appreciated that in some embodiments the MEMS heating element is configured to generate heat for calibration responsive to temperature coefficient of offset (TCO) after the MEMS sensor die is soldered on a board. In an alternative embodiment, the MEMS heating element is configured to generate heat responsive to detecting presence of liquid on the deformable membrane.

In some embodiments, a device includes a MEMS sensor die comprising a deformable membrane, a MEMS heating element, and a substrate. The MEMS heating element is integrated within a same layer and a same plane as the deformable membrane. The MEMS heating element is disposed on a periphery of the deformable membrane and is configured to generate heat to heat up the deformable membrane. The substrate is coupled to the deformable membrane. It is appreciated that the deformable membrane may be formed from a poly/single crystalline silicon layer.

In some embodiments, the device further includes another MEMS heating element integrated within the same layer and the same plane as the deformable membrane. The MEMS heating element and the another MEMS heating element are separated from one another. The another MEMS heating element is disposed on the periphery of the deformable membrane and is configured to generate heat to heat up the deformable membrane.

In some embodiments, the MEMS heating element has a gap therein. The MEMS heating element surrounds the membrane without fully encompassing the deformable membrane.

It is appreciated that in some embodiments, the device further includes a trench disposed in between the MEMS heating element and the deformable membrane. In some embodiments, the trench comprises a passivation layer. In some embodiments, the device further includes another trench that is disposed on an outer periphery of the MEMS heating element configured to electrically isolate the MEMS heating element from the peripheral layer. The another trench may be disposed between a peripheral layer and the MEMS heating element.

It is appreciated that in some embodiments a device further includes a trench disposed in between the MEMS heating element and the deformable membrane. The trench comprises a material within the trench is selected from a group consisting of Silicon Nitride and Silicon Oxide.

In some embodiments, a periphery of the deformable membrane is disposed on an oxide layer. The deformable membrane, the oxide layer, and the substrate form a cavity. The substrate includes an electrode that is formed on a top surface of the substrate that faces the deformable membrane within the cavity. The MEMS heating element is disposed on the oxide layer.

The MEMS heating element may be configured to generate heat for calibration responsive to TCO after the MEMS sensor die is soldered on a board. It is appreciated that in some embodiments, the MEMS heating element may be configured to generate heat responsive to detecting presence of liquid on the deformable membrane.

In some embodiments a device includes a sensor die comprising a deformable membrane, a substrate coupled to the deformable membrane, and a heating element disposed on a periphery of the deformable membrane and within the sensor die. The heating element is configured to heat the deformable membrane.

In some embodiments, the heating element has a gap therein. It is appreciated that the heating element surrounds the membrane without fully encompassing the deformable membrane, in some embodiments.

In some embodiments, a device further includes a trench disposed in between the heating element and the deformable membrane. The trench comprises a passivation layer.

In some embodiments, the device further includes another trench that is disposed on an outer periphery of the heating element configured to electrically isolate the heating element from the peripheral layer. It is appreciated that the another trench may be disposed between a peripheral layer and the heating element.

In some embodiments, a periphery of the deformable membrane is disposed on an oxide layer. It is appreciated that the deformable membrane, the oxide layer, and the substrate form a cavity. The substrate includes an electrode that is formed on a top surface of the substrate that faces the deformable membrane within the cavity. It is appreciated that the heating element may be disposed within a same layer as the oxide layer, e.g., on or within the oxide layer.

It is appreciated that the heating element is configured to generate heat for calibration responsive to TCO after the sensor die is soldered on a board. In some embodiments, the heating element is configured to generate heat responsive to detecting presence of liquid on the deformable membrane.

These and other features and aspects of the concepts described herein may be better understood with reference to the following drawings, description, and appended claims.

DETAILED DESCRIPTION

Figure 1A:
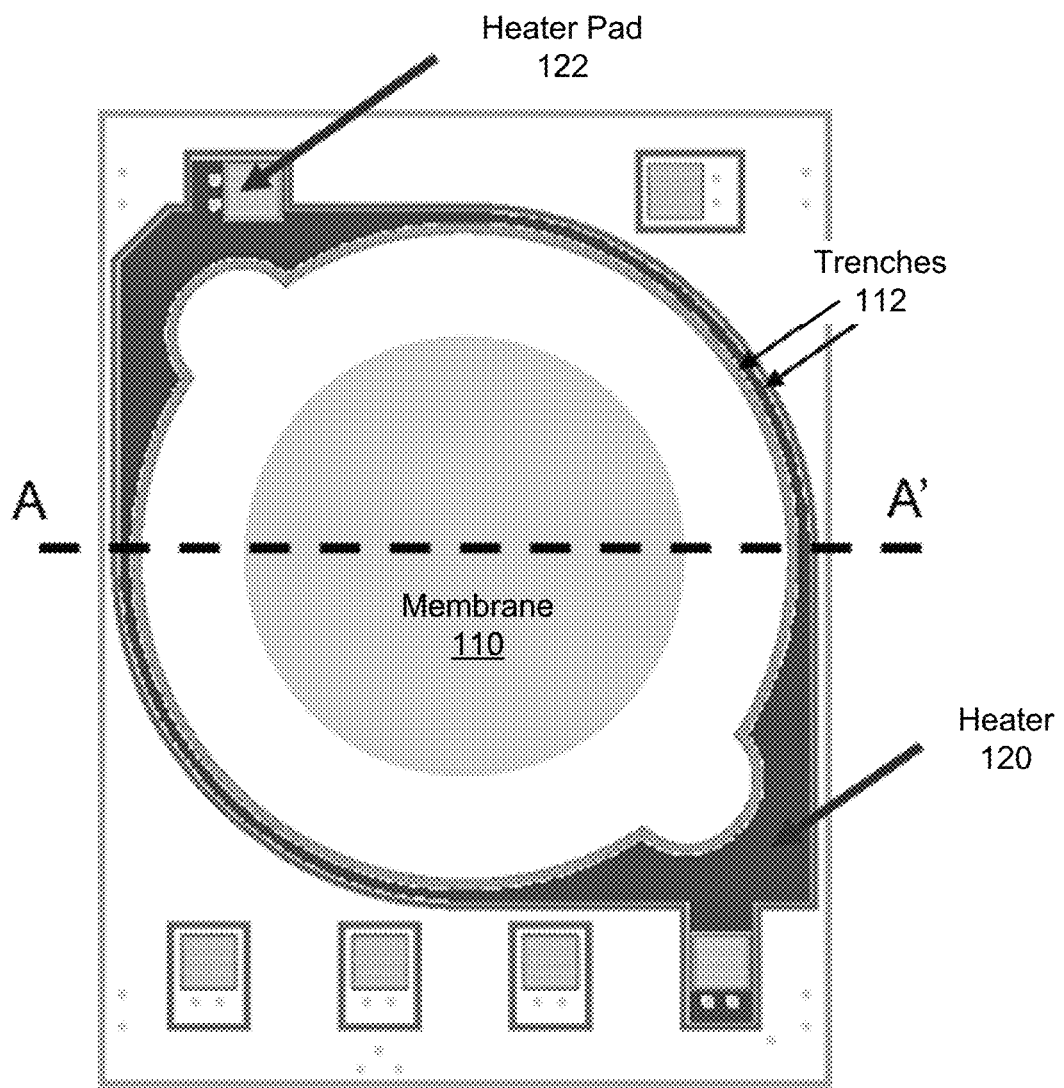
FIGS. 1A-1B show a top view and a cross-sectional view of a sensor with heater integrated therein in accordance with some embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," "periphery", "outer", and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

Many electronic devices are used in various conditions and are exposed to different external environments. For example, sensors may come in contact with the external environment such as water that may be damaging to the sensing device in addition to causing performance degradation. Unfortunately, sensors are sensitive to these external environments, e.g., water droplets on the membrane may cause an offset resulting in performance degradation. Moreover, electronic devices may be used in different temperature conditions. Unfortunately, sensor performance shifts after it is installed on a board, e.g., soldered, due to temperature dependent parameters, e.g., temperature coefficient of offset (TCO). Some attempts have been made to address performance degradation by using calibration algorithm to compensate for temperature effect before the sensor is installed, hence soldered on a board. Unfortunately, calibration algorithm used before soldering the sensor does not address or compensate for temperature coefficient offset resulting after soldering the sensor.

Accordingly, a need has arisen to calibrate the sensor after it is soldered on a board in order to address temperature coefficient offset. Furthermore, a need has arisen to address and remove liquid from the sensor environment when liquid is detected.

Figure 1B:
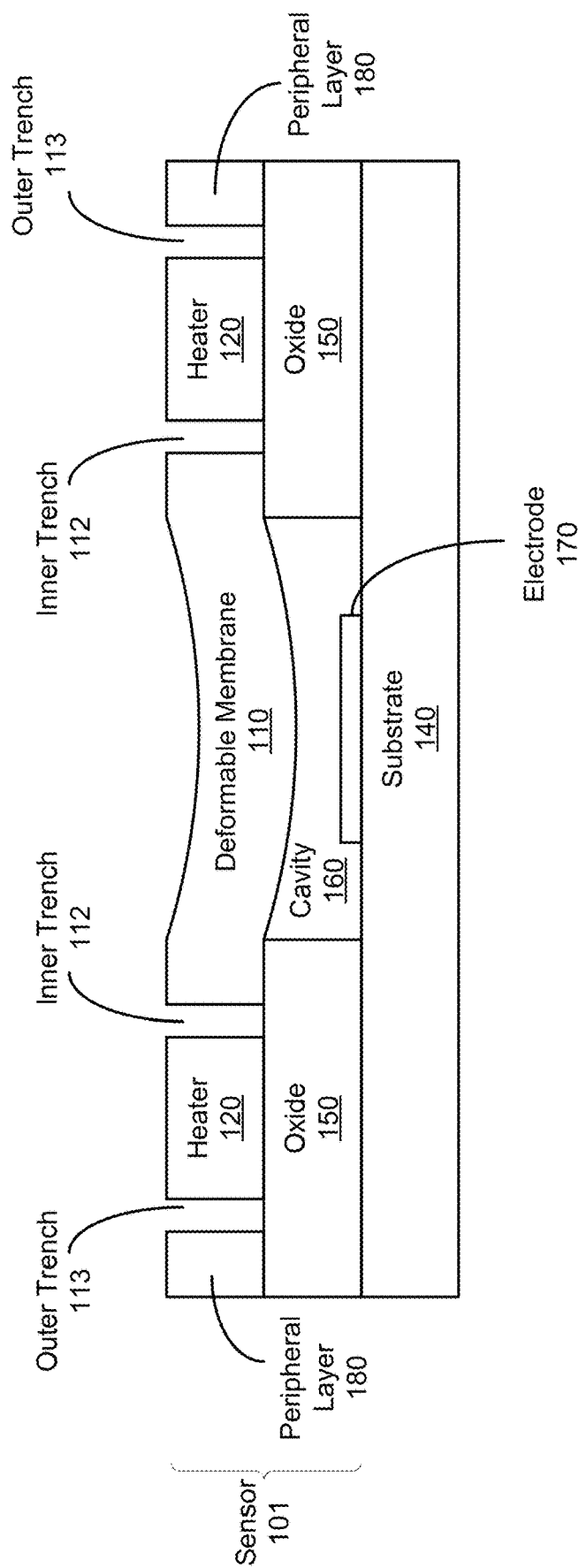

Referring now to FIGS. 1A-1B, a top view and a cross-sectional view of a sensor with heater integrated therein in accordance with some embodiments are shown. Referring specifically to FIG. 1A, a deformable membrane 110 surrounded by a heater element 120 is shown. It is appreciated that the sensor device may be a microelectromechanical system (MEMS) sensor die. The MEMS sensor die comprises a deformable membrane 110, substrate 140, oxide 150, electrode 170, a heater element 120, trenches 112-113, and a peripheral layer 180, e.g., polysilicon layer. The heater 120 element may be generally referred to as a heater, MEMS heater, etc., throughout the instant application. The heater 120 may be integrated within a same layer and a same plane as the deformable membrane 110 (this is better illustrated in FIG. 1B). It is appreciated that in some embodiments, the heater 120 may be separated from the deformable membrane 110 and from the peripheral layer 180 via trenches 112-113. In some embodiments, substrate 140 may comprise silicon. In other embodiment, substrate could be a CMOS substrate with electrical circuits. It is appreciated that the inner trench 112 (i.e. at the inner periphery) electrically isolates the heater 120 from the deformable membrane 110 while the outer trench 113 (i.e. at the outer periphery) separates the heater 120 and electrically isolates it from the peripheral layer 180. It is appreciated that the heater 120 may compose of a silicon ring that surrounds the deformable membrane 110. The deformable membrane 110 may be formed from a polysilicon layer.

The heater 120 may be coupled to the heater pad 122 in order to power the heater 120. It is appreciated that the heater 120 is configured to generate heat in order to heat the deformable membrane 110. In some embodiments, the heater 120 generates heat for calibration responsive to TCO after the MEMS sensor die is soldered on a board. For example, when an offset is detected the heater 120 may increase the temperature by 10° C. increments in order to calibrate. It is appreciated that increasing the temperature by 10° C. is for illustrative purposes and should not be construed as limiting the embodiments. For example, the heater 120 may be configured to heat up in 5° C. increments, as an example. It is further appreciated that the calibration may occur responsive to a trigger, e.g., user request, meeting a certain threshold, etc. For example, the trigger may be a signal generated responsive to detecting presence of liquid on the deformable membrane, responsive to measuring an offset, responsive to measuring a temperature difference between the MEMS device and the substrate that is greater than a threshold amount, etc.

In some embodiments, the heater 120 element may be configured to generate heat responsive to detecting presence of liquid, e.g., water droplets, on the deformable membrane. For example, in some embodiments, the heater 120 may heat up to 100° C. or slightly higher than that in order to heat up the deformable membrane 110 and cause water droplets on the deformable membrane 110 to evaporate. As such, any offset associated with presence of water droplets can be addressed by evaporating it. It is further appreciated that presence of water is for illustrative purposes and should not be construed as limiting the scope of the embodiments. For example, the embodiments are equally applicable to other forms of fluids, e.g., oil. It is appreciated that embodiments described herein can be applied to sensor devices that address liquid intrusion, as described in the U.S. patent application Ser. No. 16/520,228 and a U.S. application Ser. No. 16/378,322, both of which are claimed the benefit and priority to and are incorporated herein by reference in their entirety.

Referring specifically to FIG. 1B, a side view of a device with a heater integrated therein in accordance with some embodiments is shown. It is appreciated that the deformable membrane 110, the heater 120, and the trenches 112-113 are similar to that described in FIG. 1A. In this embodiment, the heater 120 is within the same layer and plane as the deformable membrane 110. In this embodiment, the heater 120 is within the same layer and plane as the peripheral layer 180. According to some embodiments, the heater 120 and the peripheral layer 180 are deposited on an oxide layer 150. In some embodiment, heater 120 and deformable membrane 110 comprise of polysilicon. Furthermore, it is appreciated that the periphery of the deformable membrane 110 may be coupled to the upper surface of the oxide 150 layer. It is appreciated that the oxide layer 150 may be formed over a substrate 140, e.g., a silicon substrate. Accordingly, the deformable membrane 110 the oxide layer 150 and the substrate 140 form a cavity 160. The deformable membrane 110 may deflect responsive to a stimuli, e.g., pressure. In some embodiments, an electrode 170 may be formed over the upper surface of the substrate 140 that is disposed at the bottom of the cavity 160 facing the deformable membrane 110. The deformable membrane 110 may also include an electrode (not shown) for thereon or integrated therein. The electrode on the deformable membrane and electrode 170 for a capacitor. As such, deflection of the deformable membrane 110 changes the charges on the electrodes of the capacitor.

It is appreciated that in some embodiments the trenches 112 are within a passivation layer. It is appreciated that in some embodiments, the trenches 112 may be deposited with certain material such as Silicon Nitride, Silicon Oxide, etc. As illustrated, an inner trench and an outer trench are used. For example, the inner periphery trench is a trench disposed between deformable membrane 110 and the heater 120 while the outer periphery trench is a trench disposed between the heater 120 and the peripheral layer 180.

It is appreciated that the heater 120 is designed within a same layer as the surrounding sensor membrane, e.g., single crystalline silicon. Accordingly, a need to use any adjacent metal structure layers is eliminated, thereby reducing metal stress effect. Moreover, using the heater 120 enables the device to calibrate after the sensor is soldered on board or throughout its lifetime. It is also appreciated that use of the heater 120, as described, is a liquid ejection mechanism, e.g., by evaporating liquid such as water or oil. Moreover, it is appreciated that the heater 120, as described, surrounds the deformable membrane 110, thus creates temperature uniformity for the deformable membrane 110. However, it is appreciated that in some embodiments, the heater 120 may include a plurality of heaters that is separated by a gap therein or the heater 120 may not completely surround and encompass the deformable membrane 110. Thus, the heater 120 surrounding and encompassing the deformable membrane 110 is for illustrative purposes only and should not be construed as limiting the scope of the embodiments. It is appreciated that other structural configurations are shown in subsequent figures. It is also appreciated that in some embodiments another heater (not shown) may be used to heat the substrate 140 while the heater 120 may be used to heat the sensor 101 (i.e. MEMS device such as a pressure sensor) such that the heater 120 is used to selectively fine tune the temperature of the MEMS device by heating the deformable membrane 110 and to reduce the temperature difference between the substrate 140 and the MEMS device 101. It is appreciated that the calibration may occur responsive to a trigger, e.g., user request, meeting a certain threshold, etc. For example, the trigger may be a signal generated responsive to detecting presence of liquid on the deformable membrane, responsive to measuring an offset, responsive to measuring a temperature difference between the MEMS device and the substrate that is greater than a threshold amount, etc.

Figure 2:
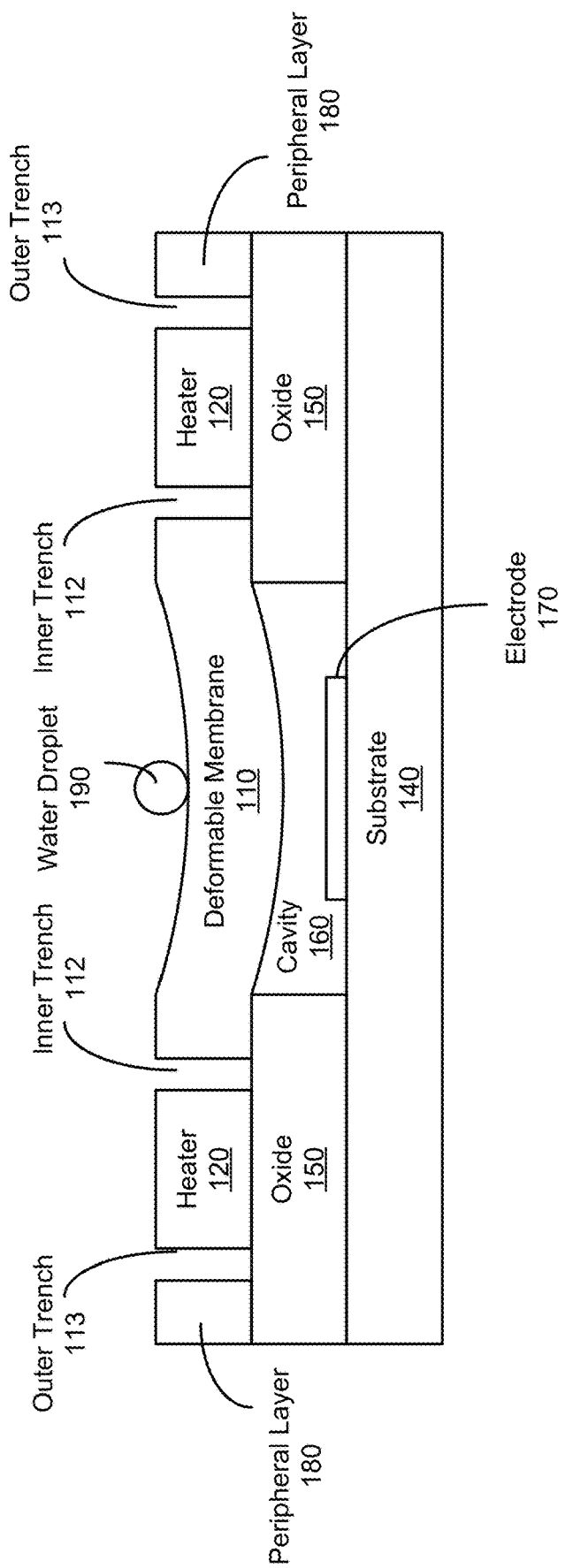
FIG. 2 shows a sensor device with a heater integrated therein configured to heat to evaporate water droplets on its deformable membrane in accordance with some embodiments.

FIG. 2 shows a sensor device with a heater integrated therein configured to heat to evaporate water droplets on its deformable membrane in accordance with some embodiments. FIG. 2 is substantially similar to that of FIGS. 1A-1B. In this embodiment, a water droplet 190 is formed over the deformable membrane 110, thereby creating an offset and causing performance issues. It is appreciated that presence of water droplet 190 may have been detected by the device. As such, the heater 120 element may start heating up to 100°

C. or slightly above 100° C. to heat the deformable membrane 110. As such, the water droplet 190 is evaporated in response thereto, thereby addressing any offsets created resulting from the water droplet 190.

Figure 3:
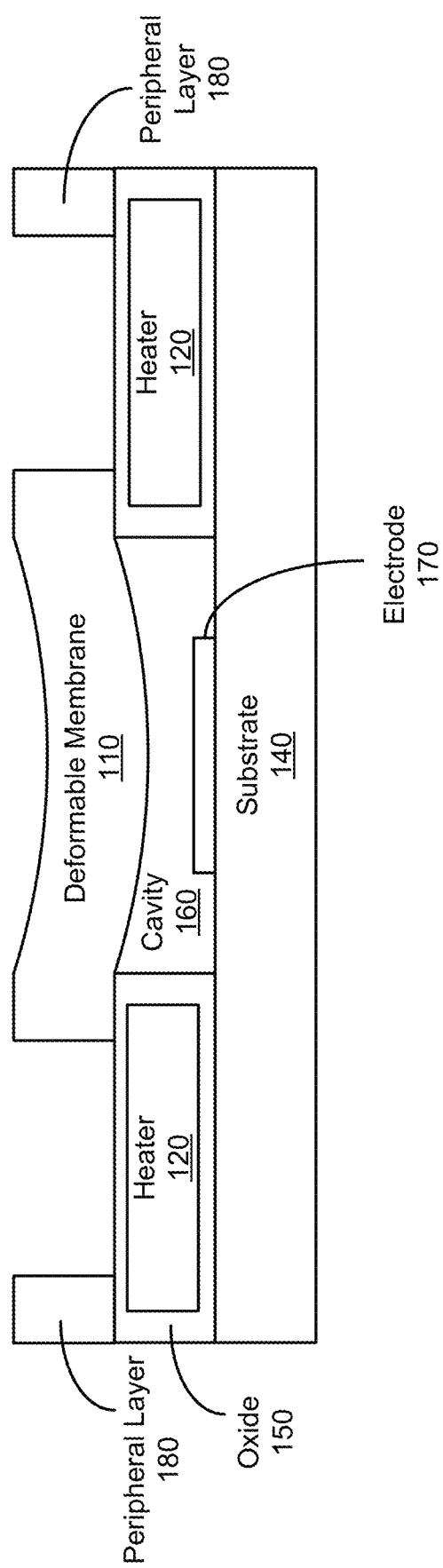
FIG. 3 shows another sensor device with a heater integrated therein in accordance with some embodiments.

Referring now to FIG. 3, another sensor device with a heater integrated therein in accordance with some embodiments is shown. FIG. 3 is substantially similar to those described in FIGS. 1A-2. However, in this embodiment, the heater 120 is integrated within the oxide layer 150 instead of being within the same layer and plane as the deformable membrane 110 or the peripheral layer 180. In other words, the heater 120 is integrated within the oxide layer 150 and below the peripheral layer 180 and the deformable membrane 110.

Figure 4:
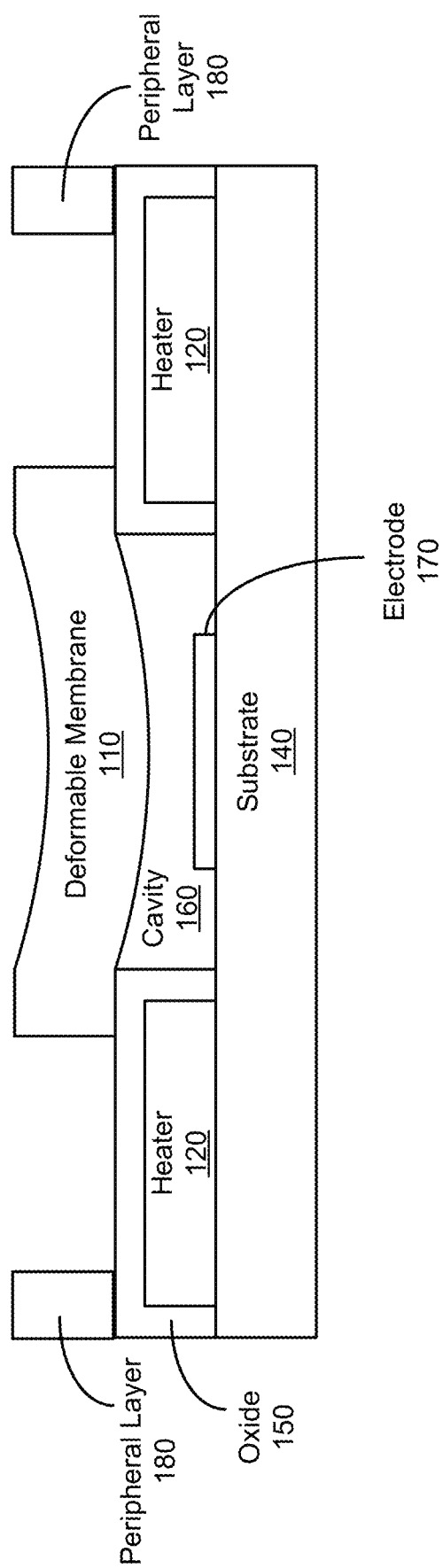
FIG. 4 shows yet another sensor device with a heater integrated therein in accordance with some embodiments.

Referring now to FIG. 4, yet another sensor device with a heater integrated therein in accordance with some embodiments is shown. FIG. 4 is similar to that of FIG. 3 except that in this embodiment, the lower surface of the heater 120 is in contact with the upper surface of the substrate 140.

Figure 5:
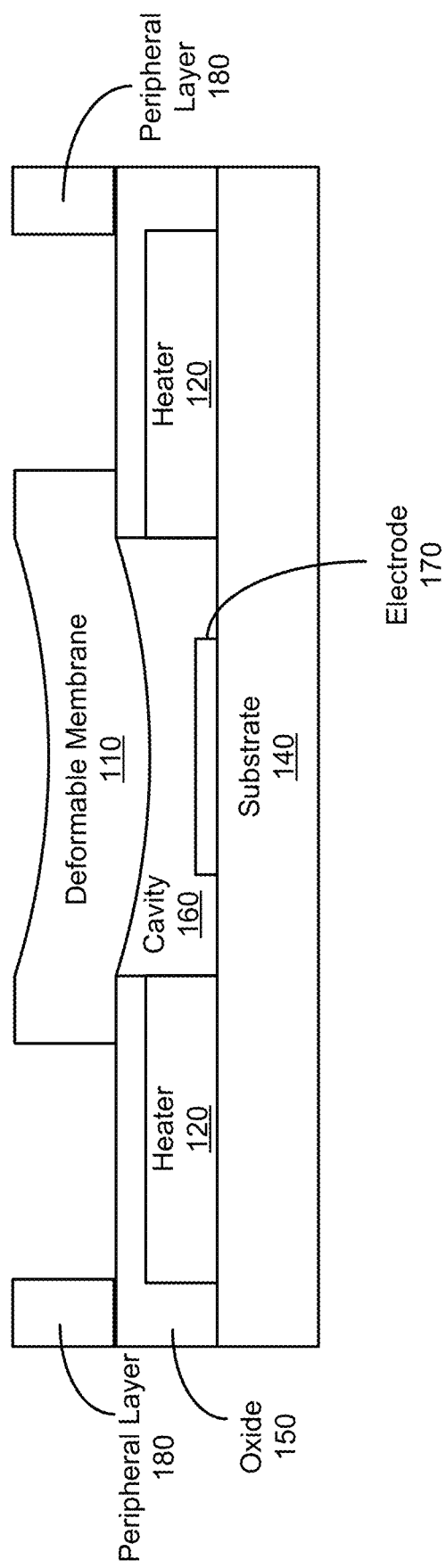
FIG. 5 shows an alternative sensor device with a heater integrated therein in accordance with some embodiments.

Referring now to FIG. 5, an alternative sensor device with a heater integrated therein in accordance with some embodiments is shown. FIG. 5 is similar that of FIG. 4 except that at least one side of the heater 120 is exposed to the cavity 160. As such, the heater 120 heating up also heats up the cavity 160 and therefore the deformable membrane 110.

Figure 6A:
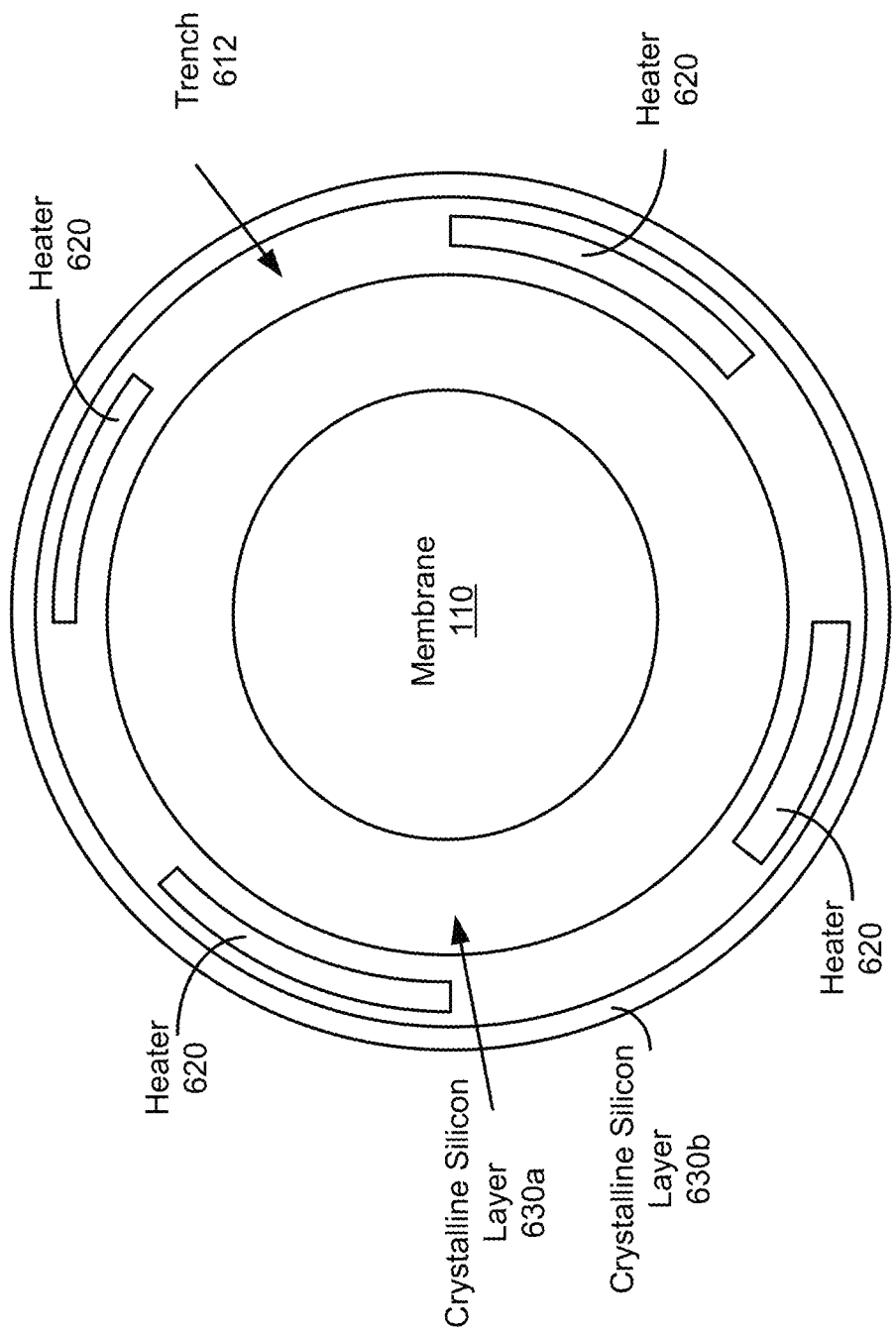
FIGS. 6A-6B show top views of a sensor with different heater configuration integrated therein in accordance with some embodiments.

Referring now to FIG. 6A, a top view of a sensor with different heater configuration integrated therein in accordance with some embodiments is shown. In this embodiment, four heaters are used, e.g., heaters 620. The heaters 620 are separated from one another through a gap or trench 612. The deformable membrane 110 is surrounded by an inner crystalline silicon layer 630a. It is appreciated that use of crystalline silicon layer is for illustrative purposes and should not be construed as limiting the embodiments. For example, a polysilicon layer may be used. The trench 612 separates the heaters 620 from the crystalline silicon layer 630a and the deformable membrane 110. It is appreciated that the trench 612 also separates the heaters 620 from the outer crystalline silicon layer 630b in order to provide electrical isolation with the peripheral layer (not shown here).

Figure 6B:
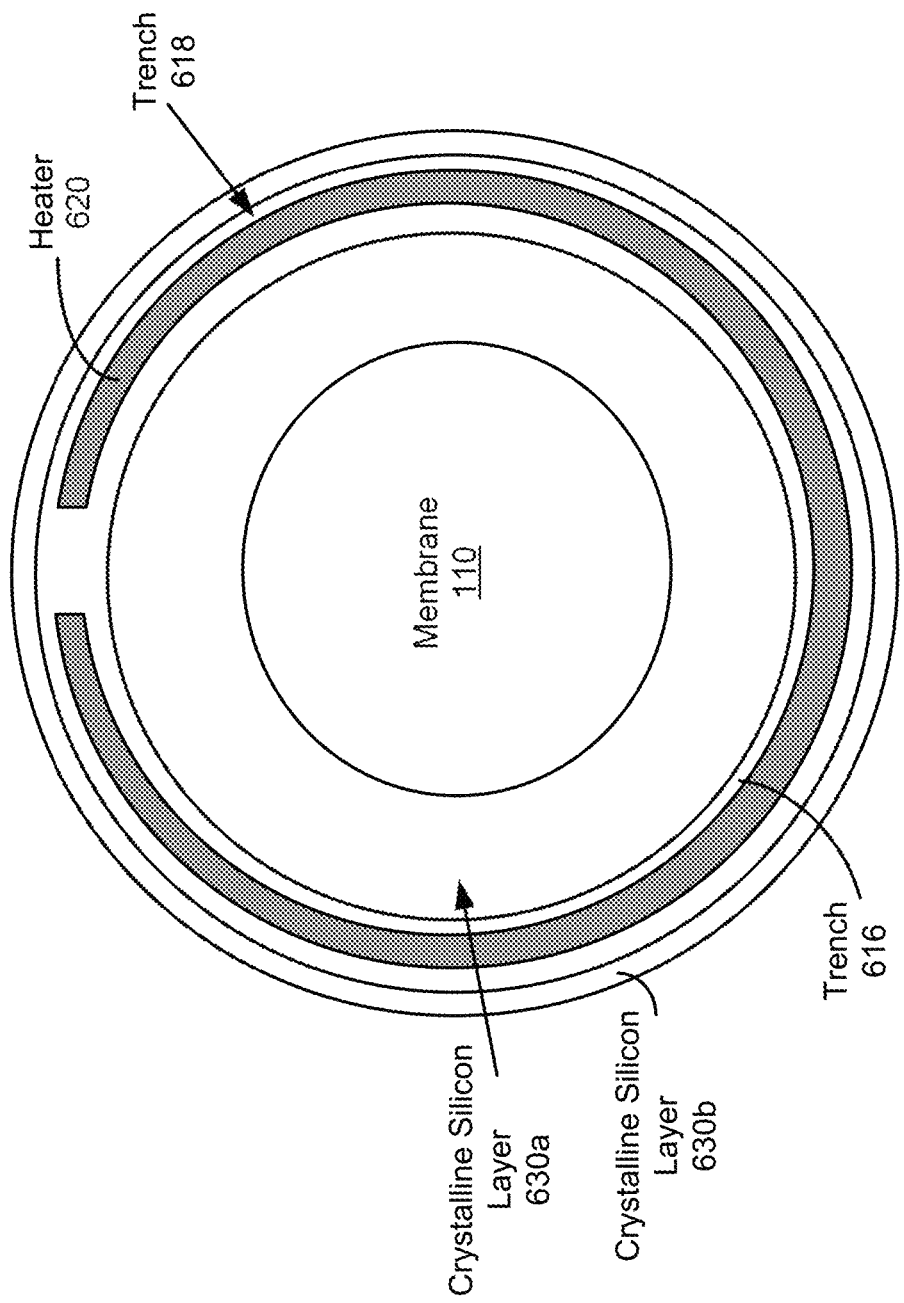

Referring now to FIG. 6B, a top view of a sensor with different heater configuration integrated therein in accordance with some embodiments is shown. In this embodiment, a single heater 620 is used where it substantially surrounds the deformable membrane 110 without completely enclosing it. As such, the two ends of the heater 620 are separated from one another using a gap or a trench. The trench 616 separates the heater 620 from the inner crystalline silicon layer 630a whereas trench 618 separates the heater 620 from the outer crystalline silicon layer 630b. The trenches 612, 616 and/or 618 may be formed on a passivation layer and may include material such as Silicon Nitride, Silicon Oxide, etc.

FIGS. 6A and 6B are illustrated to show that the heater may have any shape or form. As such, a particular shape or the number of heaters used are for illustrative purposes only and should not be construed as limiting the embodiments. Accordingly, the sensor can calibrate after it is soldered on a board in order to address temperature coefficient offset. Furthermore, liquids can be removed from the sensor environment when liquid is detected by heating up the heater element and thereby the deformable membrane, thereby addressing any offset resulting from presence of the liquids. It is appreciated that the calibration may occur responsive to a trigger, e.g., user request, meeting a certain threshold, etc. For example, the trigger may be a signal generated responsive to detecting presence of liquid on the deformable membrane, responsive to measuring an offset, responsive to measuring a temperature difference between the MEMS device and the substrate that is greater than a threshold amount, etc.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A device comprising:
a microelectromechanical system (MEMS) sensor die comprising:
a deformable membrane;
a MEMS heating element integrated within a same layer and a same plane as the deformable membrane;
wherein the MEMS heating element is disposed on the outer periphery of the deformable membrane;
wherein the MEMS heating element is electrically isolated from the deformable membrane by a trench;
wherein the MEMS heating element is configured to generate heat to heat up the deformable membrane.

2. The device of claim 1, wherein the trench is within a silicon layer.

3. The device of claim 1, wherein a material within the trench is selected from a group consisting of Silicon Nitride and Silicon Oxide.

4. The device of claim 1 further comprising another trench, wherein the another trench is positioned on an outer periphery of the MEMS heating element configured to electrically isolate the MEMS heating element from a peripheral layer.

5. The device of claim 1, wherein a periphery of the deformable membrane is positioned on an oxide layer, and wherein the deformable membrane, the oxide layer, and the substrate form a cavity, and wherein the substrate includes an electrode that is formed on a top surface of the substrate that faces the deformable membrane within the cavity.

6. The device of claim 5, wherein the MEMS heating element is disposed on the oxide layer.

7. The device of claim 1, wherein the MEMS heating element is configured to generate heat for calibration responsive to temperature coefficient of offset (TCO).

8. The device of claim 7, wherein the calibration is performed in response to a trigger.

9. The device of claim 1, wherein the MEMS heating element is configured to generate heat responsive to detecting presence of liquid on the deformable membrane.

10. A device comprising a microelectromechanical system (MEMS) sensor die comprising:
a deformable membrane;
a MEMS heating element integrated within a same layer and a same plane as the deformable membrane,
wherein the MEMS heating element is disposed on a periphery of the deformable membrane and is configured to generate thermal energy to heat up the deformable membrane, and wherein the MEMS heating element has a gap therein, wherein the MEMS heating element surrounds the membrane without fully encompassing the deformable membrane; and a substrate.

11. The device of claim 10 further comprising another MEMS heating element integrated within the same layer and the same plane as the deformable membrane, wherein the MEMS heating element and the another MEMS heating element are separated from one another, and wherein the another MEMS heating element is positioned on the periphery of the deformable membrane and is configured to generate thermal energy to heat up the deformable membrane.

12. The device of claim 10 further comprising a trench disposed in between the MEMS heating element and the deformable membrane, and wherein the trench comprises a material within the trench is selected from a group consisting of Silicon Nitride and Silicon Oxide.

13. The device of claim 10, wherein a periphery of the deformable membrane is disposed on an oxide layer, and wherein the deformable membrane, the oxide layer, and the substrate form a cavity, and wherein the substrate includes an electrode that is formed on a top surface of the substrate that faces the deformable membrane within the cavity, and wherein the MEMS heating element is disposed on the oxide layer.

14. The device of claim 10, wherein the deformable membrane is formed from a peripheral layer.

15. The device of claim 10, wherein the MEMS heating element is configured to generate heat for calibration responsive to temperature coefficient of offset (TCO) after the MEMS sensor die is soldered on a board.

16. The device of claim 10, wherein the MEMS heating element is configured to generate heat responsive to detecting presence of liquid on the deformable membrane.

17. A device comprising a microelectromechanical system (MEMS) sensor die comprising:

a deformable membrane;

a MEMS heating element integrated within a same layer and a same plane as the deformable membrane, wherein the MEMS heating element is disposed on a periphery of the deformable membrane and is configured to generate thermal energy to heat up the deformable membrane; and a substrate, wherein a trench is disposed in between the MEMS heating element and the deformable membrane, and wherein the trench comprises a material within the trench is selected from a group consisting of Silicon Nitride and Silicon Oxide.

* * * * *